United States Patent
Glickman et al.

(10) Patent No.: US 10,985,484 B1
(45) Date of Patent: Apr. 20, 2021

(54) ELECTRONIC CONDUCTIVE INTERCONNECTION FOR BRIDGING ACROSS IRREGULAR AREAS IN A TEXTILE PRODUCT

(71) Applicant: Flex Ltd., Singapore (SG)

(72) Inventors: Michael James Glickman, Mountain View, CA (US); Shane Bravard, San Jose, CA (US); Mudhafar Hassan-Ali, Menlo Park, CA (US); Yolita Nugent, Chestnut Hill, MA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/590,162

(22) Filed: Oct. 1, 2019

Related U.S. Application Data

(60) Provisional application No. 62/739,661, filed on Oct. 1, 2018.

(51) Int. Cl.
 *H01R 12/81* (2011.01)
 *H05K 1/03* (2006.01)
 *H05K 1/18* (2006.01)
 *H05K 1/02* (2006.01)

(52) U.S. Cl.
 CPC ........... *H01R 12/81* (2013.01); *H05K 1/0283* (2013.01); *H05K 1/038* (2013.01); *H05K 1/189* (2013.01); *H05K 2201/0281* (2013.01)

(58) Field of Classification Search
 CPC ...... H01R 12/81; H05K 1/038; H05K 1/0283; H05K 1/189; H05K 2201/0281
 USPC ........................................................ 439/586
 See application file for complete search history.

(56) References Cited

U.S. PATENT DOCUMENTS

| 2,649,267 | A | * | 8/1953 | Luke | ................. | B64D 15/12 |
|---|---|---|---|---|---|---|
| | | | | | | 244/134 D |
| 3,673,572 | A | | 6/1972 | Silva | | |
| 5,433,735 | A | * | 7/1995 | Zanakis | ................. | A61N 1/205 |
| | | | | | | 607/116 |

(Continued)

FOREIGN PATENT DOCUMENTS

JP   2013187380 A   9/2013

OTHER PUBLICATIONS

Kwang-Seok Kim, Design and fabrication of Screen-Printed Silver Circuits for Stretchable Electronics, Jul. 13, 2013 (Year 2013).

(Continued)

*Primary Examiner* — Peter G Leigh
(74) *Attorney, Agent, or Firm* — Haverstock & Owens LLP

(57) ABSTRACT

A seam jump connector provides connectivity over an irregular area, such as seam, in a textile. The textile is part of a textile base structure that includes one or more electrically conductive interconnects formed either directly on the textile or on intermediate substrates that are attached to the textile. The intermediate substrates can be TPU sheets having conductive interconnects printed on a surface. The conductive interconnects of the textile base structure are discontinuous at an irregular area on the textile, and the seam jump connector includes a flexible and/or stretchable substrate with conductive interconnects. The seam jump connector is aligned with and stacked onto the conductive interconnects so as to provide electrical connectivity across the irregular area. The seam jump connectors can be configured to be permanently or removably attached to the textile base structure.

18 Claims, 9 Drawing Sheets

(56) References Cited

U.S. PATENT DOCUMENTS

| | | | |
|---|---|---|---|
| 6,743,982 B2 * | 6/2004 | Biegelsen | B25J 13/084 |
| | | | 174/69 |
| 7,022,917 B2 * | 4/2006 | Jung | D03D 1/0082 |
| | | | 174/88 R |
| 7,072,721 B1 | 7/2006 | Trent | |
| 8,207,473 B2 * | 6/2012 | Axisa | H05K 1/0283 |
| | | | 219/121.72 |
| 8,282,232 B2 * | 10/2012 | Hsu | D03D 3/005 |
| | | | 362/103 |
| 8,987,707 B2 | 3/2015 | Arnold | |
| 9,148,949 B2 * | 9/2015 | Zhou | H05K 1/0283 |
| 9,174,042 B2 * | 11/2015 | Schonenberger | A61N 1/0492 |
| 9,674,950 B1 * | 6/2017 | Liu | H05K 1/18 |
| 9,706,647 B2 | 7/2017 | Hsu | |
| 9,706,648 B2 * | 7/2017 | Zhou | H05K 1/038 |
| 9,736,930 B2 | 8/2017 | Yang | |
| 9,788,789 B2 | 10/2017 | Bailey | |
| 9,826,633 B2 * | 11/2017 | Cherenack | H05K 1/0283 |
| 9,832,863 B2 * | 11/2017 | Elsherbini | H05K 1/0283 |
| 9,839,123 B2 * | 12/2017 | Van Keymeulen | H05K 1/111 |
| 9,842,269 B2 | 12/2017 | Park | |
| 9,844,133 B2 | 12/2017 | Tomita | |
| 9,883,583 B2 * | 1/2018 | Cousins | G06F 1/1662 |
| 10,194,861 B2 | 2/2019 | Okumura | |
| 10,204,855 B2 | 2/2019 | Levander | |
| 10,310,560 B2 | 6/2019 | Choi | |
| 10,575,381 B1 | 2/2020 | Uy | |
| 2001/0018809 A1 | 9/2001 | Heropoulos | |
| 2004/0243204 A1 * | 12/2004 | Maghribi | A61N 1/05 |
| | | | 607/115 |
| 2004/0244193 A1 * | 12/2004 | Jung | H05K 3/363 |
| | | | 29/854 |
| 2006/0135863 A1 | 6/2006 | Birnbaum | |
| 2006/0258205 A1 * | 11/2006 | Locher | H05K 1/038 |
| | | | 439/517 |
| 2008/0093118 A1 | 4/2008 | Takahashi | |
| 2008/0099230 A1 | 5/2008 | Takahashi | |
| 2008/0137275 A1 | 6/2008 | Tada | |
| 2008/0258314 A1 * | 10/2008 | Yoo | H01L 23/14 |
| | | | 257/784 |
| 2009/0229876 A1 | 9/2009 | Takahashi | |
| 2009/0317639 A1 | 12/2009 | Axisa | |
| 2010/0014265 A1 | 1/2010 | Sagisaka | |
| 2010/0018634 A1 | 1/2010 | Takahashi | |
| 2010/0025087 A1 | 2/2010 | Takahashi | |
| 2011/0067904 A1 | 3/2011 | Aoyama | |
| 2011/0180307 A1 | 7/2011 | Naganuma | |
| 2011/0198111 A1 | 8/2011 | Naganuma | |
| 2011/0199739 A1 | 8/2011 | Naganuma | |
| 2012/0052268 A1 * | 3/2012 | Axisa | H01L 23/4985 |
| | | | 428/212 |
| 2012/0165633 A1 | 6/2012 | Khair | |
| 2012/0176764 A1 | 7/2012 | Loher | |
| 2012/0238910 A1 | 9/2012 | Nordstrom | |
| 2012/0325524 A1 | 12/2012 | Naganuma | |
| 2014/0290999 A1 | 10/2014 | Park | |
| 2015/0114689 A1 | 4/2015 | Ishihara | |
| 2015/0114690 A1 | 4/2015 | Ishihara | |
| 2015/0366504 A1 | 12/2015 | Connor | |
| 2016/0160403 A1 * | 6/2016 | Van Keymeulen | H01L 23/4985 |
| | | | 428/221 |
| 2016/0270727 A1 | 9/2016 | Berg | |
| 2017/0172421 A1 | 6/2017 | Dabby | |
| 2017/0370030 A1 * | 12/2017 | Podhajny | G06F 3/044 |
| 2018/0249767 A1 | 9/2018 | Begriche | |

OTHER PUBLICATIONS

Non Final Office Action dated Dec. 9, 2019, U.S. Appl. No. 14/724,673, filed May 28, 2015, applicant: Weifeng Liu, 17 pages.

* cited by examiner

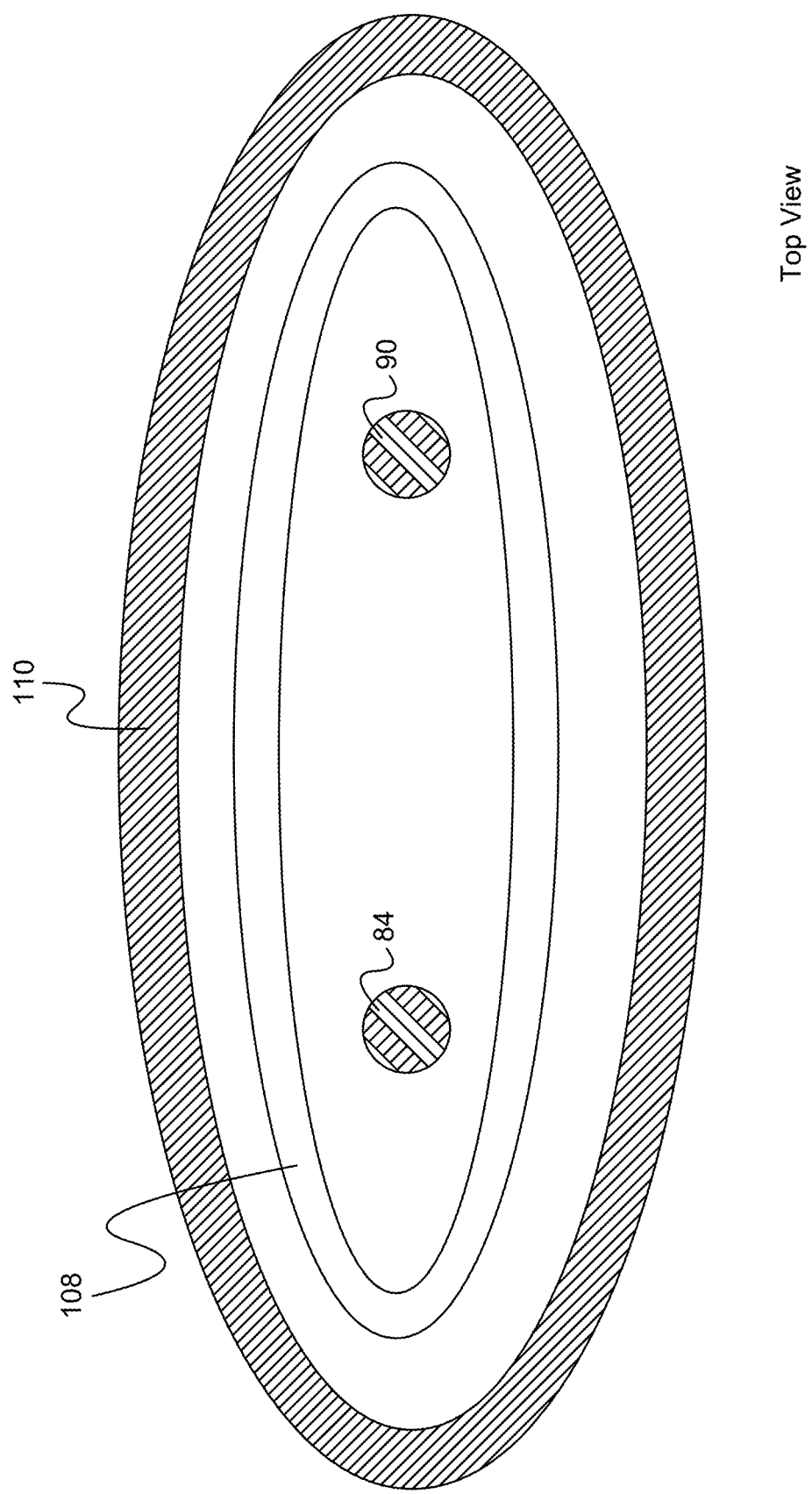

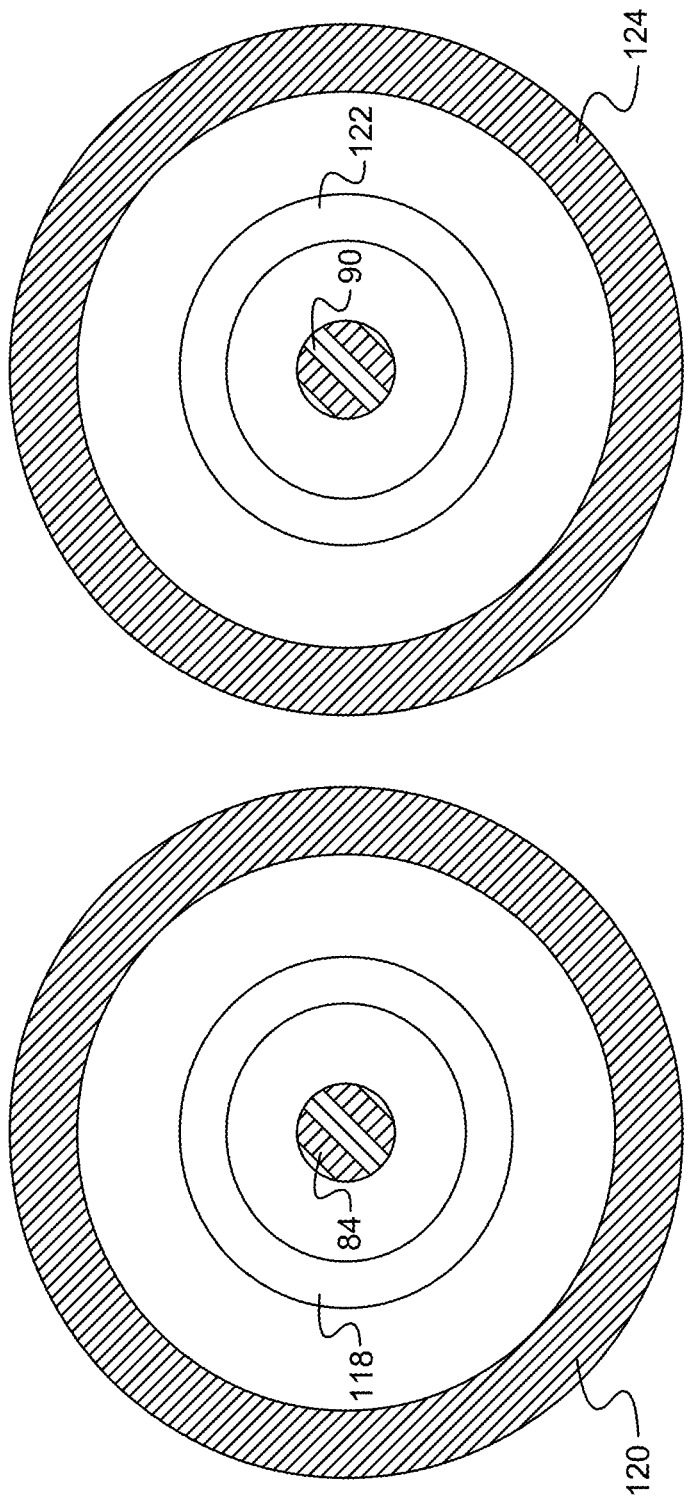

ELECTRONIC CONDUCTIVE INTERCONNECTION FOR BRIDGING ACROSS IRREGULAR AREAS IN A TEXTILE PRODUCT

RELATED APPLICATIONS

This Patent Application claims priority under 35 U.S.C. 119(e) of the U.S. provisional patent application, Application Serial No. 62/739,661, filed on Oct. 1, 2018, and entitled "E-Textile Connection Methods", which is hereby incorporated in its entirety by reference.

FIELD OF THE INVENTION

The present invention is generally directed to incorporating electronics with textiles. More specifically, the present invention is directed to methods and structures for providing electrically conductive interconnects on textiles.

BACKGROUND OF THE INVENTION

Electronic devices are increasingly being developed that are able to bend, flex and twist, such as in wearable electronics. These mechanical requirements present reliability challenges on mechanical components, circuit boards and interconnects, as well as electronic components. In order to limit the stress and strain to these components while still maintaining flexibility, mechanical provisions must be put in place.

Flexible printed circuits (FPC) provide circuit board structures that are less rigid than earlier generation printed circuit boards, and enable varying degrees of flexing, bending and twisting. Flexible interconnects between conductive wires and FPCs are needed for applications where durability and flexibility are a concern.

Electronics, especially flexible electronics, are being incorporated with textiles to form electronic textiles having various electronic textile architectures designed to support and enhance electronic systems. Exemplary types of electronics incorporated into electronic textiles include, but are not limited to, sensors, actuators, smart materials, and flexible electronics such as FPCs, as well as the electrically conductive interconnects that interconnect the electronics to each other and/or interconnect the electronics to external connectivity points for off-textile interconnection. In many applications, the textile is formed by attaching multiple smaller textiles together, such as multiple different fabric pieces sewn together to form a garment. The interface between joined textile pieces forms a seam in the surface of the textile. Other types of irregularities on the textile surface may also be formed other than by joining together two separate textile pieces, such as an irregularity formed at a point where a textile is sewn to an underlying substrate. Providing interconnection across a seam or other type of irregularity in the textile is often problematic.

SUMMARY OF THE INVENTION

Embodiments are directed to a seam jump connector configured to provide connectivity over an irregular area, such as seam, in a textile. The textile is part of a textile base structure that includes one or more electrically conductive interconnects formed either directly on the textile or on intermediate substrates that are attached to the textile. The intermediate substrates can be in the form of thermoplastic polyurethane (TPU) sheets having conductive interconnects printed on a surface. The conductive interconnects of the textile base structure are discontinuous at an irregular area on the textile, and the seam jump connector includes a flexible and/or stretchable substrate with conductive interconnects. The seam jump connector is aligned with and stacked onto the conductive interconnects of the textile base structure such that one of the conductive interconnects on the seam jump connector is connected to a corresponding conductive interconnects on either side of the irregular area of the textile, thereby providing electrical connectivity across the irregular area. The seam jump connectors can be configured to be permanently or removably attached to the textile base structure.

In an aspect, a conductive interconnect assembly is disclosed. The conductive interconnect assembly includes a textile, a first conductive interconnect, a second conductive interconnect, and an irregular area jump connector. The textile has an irregular area. The first conductive interconnect is coupled to the textile and positioned on a first side of the irregular area, wherein the first conductive interconnect includes a first connection point. The second conductive interconnect is coupled to the textile and positioned on a second side of the irregular area, the second side is separated from the first side by the irregular area. The second conductive interconnect includes a second connection point. The irregular area jump connector comprises a flexible substrate and a third conductive interconnect coupled to flexible substrate. The third conductive interconnect comprises a third connection point and a fourth connection point. The irregular area jump connector is stacked over the irregular area of the textile, over at least the first connection point of the first conductive interconnect, and over at least the second connection point of the second conductive interconnect, and the third connection point is aligned with and coupled to the first connection point, and the fourth connection point is aligned with and coupled to the second connection point to form an electrical connection between the first conductive interconnect, the second conductive interconnect, and the third conductive interconnect. In some embodiments, the first conductive interconnect and the second conductive interconnect are positioned directly on a surface of the textile. In some embodiments, the conductive interconnect assembly further comprises a first substrate having a first surface onto which the first conductive interconnects are coupled and a second surface opposing the first surface, and a second substrate having a first surface onto which the second conductive interconnects are coupled and a second surface opposite the first surface, wherein the first surface of the first substrate is coupled to the first side of the textile and the first surface of the second substrate is coupled to the second side of the textile. In some embodiments, the first substrate and the second substrate each comprise thermoplastic polyurethane (TPU). In some embodiments, the flexible substrate comprises thermoplastic polyurethane (TPU). In some embodiments, the flexible substrate comprises a flexible printed circuit (FPC). In some embodiments, the irregular area comprises a seam in the textile. In some embodiments, the first connection point and the third connection point are mechanically connected directly to each other, and the second connection point and the fourth connection point are mechanically connected directly to each other. In some embodiments, the conductive interconnect assembly further comprises a first conductive adhesive positioned between the first connection point and the third connection point, and a second conductive adhesive positioned between the second connection point and the fourth connection point. In some embodiments, the irregular area jump connector is laminated to the textile. In some embodiments, the irregular area jump connector further comprises a cover layer, a first securing device, and a second securing device, further wherein the cover layer is stacked over an opposite side of the textile as the flexible substrate, and the first securing device and the second securing device compress together the stack. In some embodiments, the conductive interconnect assembly further comprises a first mated pair of electrical connectors and a second mated pair of electrical connectors, wherein the first mated pair comprises a first electrical connector coupled to the first connection point of the first conductive interconnect and a second electrical connector coupled to the third connection point of the third conductive interconnect, further wherein the second mated pair comprises a third electrical connector coupled to the second connection point of the second conductive interconnect and a fourth electrical connector coupled to the fourth connection point of the third conductive interconnect. In some embodiments, the flexible substrate comprises a flexible printed circuit (FPC) coupled to the first and second mated pair of electrical connectors. In some embodiments, the conductive interconnect assembly further comprises a printed circuit board (PCB) coupled to the FPC. In some embodiments, the PCB is coupled to the FPC via a PCB to FPC connector. In some embodiments, the first mated pair of electrical connectors and the second mated pair of electrical connectors each comprise magnetically attracted connectors. In some embodiments, the first mated pair of electrical connectors and the second mated pair of electrical connectors each comprise zero force insertion (ZIF) connectors.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 14 illustrates a top down view of the relative positions of the sealing structure and the pressure maintaining device relative to the electrical connectors and according to some embodiments.

FIG. 15 illustrates a top down view of individually isolated electrical connectors.

DETAILED DESCRIPTION OF THE EMBODIMENTS

Embodiments of the present application are directed to e-textile (electronic textiles) interconnects. Those of ordinary skill in the art will realize that the following detailed description of e-textile interconnects is illustrative only and is not intended to be in any way limiting. Other embodiments of e-textile interconnects will readily suggest themselves to such skilled persons having the benefit of this disclosure.

Reference will now be made in detail to implementations of the e-textile interconnects as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, fabrics, textiles, and the like are collectively referred to as textiles. As also used herein, the term "textile" generally applies to cloth or other similar materials made of threads, fibers, filaments, or the like. Materials used for textile threads can include, but are not limited to, cotton, wool, nylon, polyester or other synthetic materials.

Figure 1:
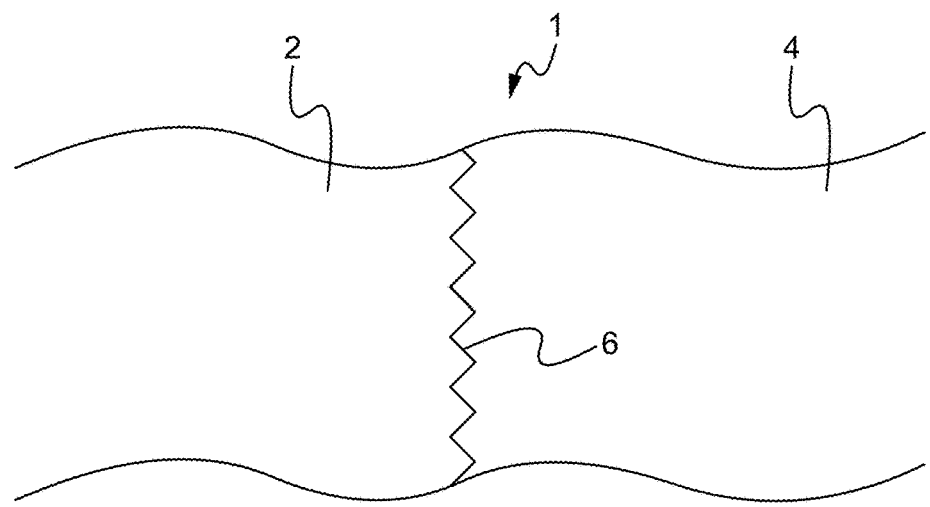
FIG. 1 illustrates a portion of a textile formed by joining two separate textile pieces according to an embodiment.

FIG. 1 illustrates a portion of a textile formed by joining two separate textile pieces according to an embodiment. The textile 1 includes a first textile piece 2 and a second textile piece 4 joined together. The interface at which the two textile pieces are joined forms an irregularity 6 in the surface of the textile 1. As described herein, this irregularity is referred to as a seam, such as the seam 6. In an exemplary application, the two textile pieces are sewn together. It is understood that although such an irregularity is subsequently referred to as a seam the irregularity can be formed due to causes other than sewing separate textile pieces together such as sewn channels, pleats, ridges, or other design features.

Figure 2:
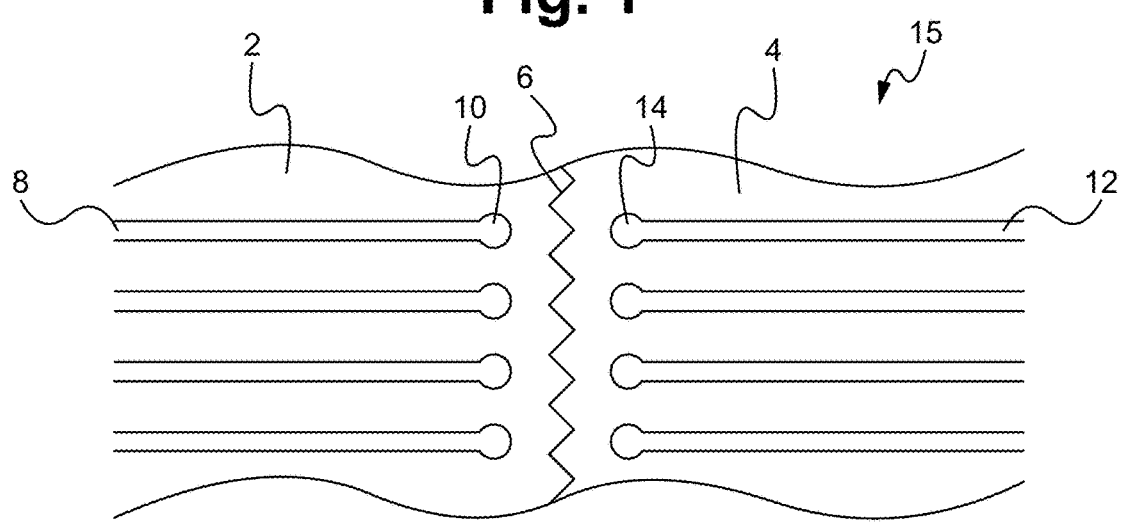
FIG. 2 illustrates the textile having conductive interconnects according to some embodiments.

Electrically conductive interconnects, or simply "conductive interconnects", can be formed on the textile 1. In some embodiments, the conductive interconnects are formed directly on a surface of the textile 1, such as by printing. FIG. 2 illustrates the textile 1 having conductive interconnects according to some embodiments. Conductive interconnects 8 are formed on the first textile piece 2 and conductive interconnects 12 are formed on the second textile piece 4. Each of the conductive interconnects 8 has a connection point 10, such as a contact pad, and each of the conductive interconnects 12 has a connection point 14, such as a contact pad. In the exemplary configuration shown in FIG. 2, the conductive interconnects 8, 12 are formed on a surface of the first textile piece 2, and the conductive interconnects 12 are formed on a surface of the second textile piece 4. Alternatively, some or all of the conductive interconnects 8, 12 can be embedded within the textile, except for connection points 10, 14 which are exposed. In some embodiments, connection points 10, 14 may represent vias that are connected to underlying conductive interconnects formed in the textile. It is understood that more or less than the four conductive interconnects shown in FIG. 2 can be included.

Figure 3:
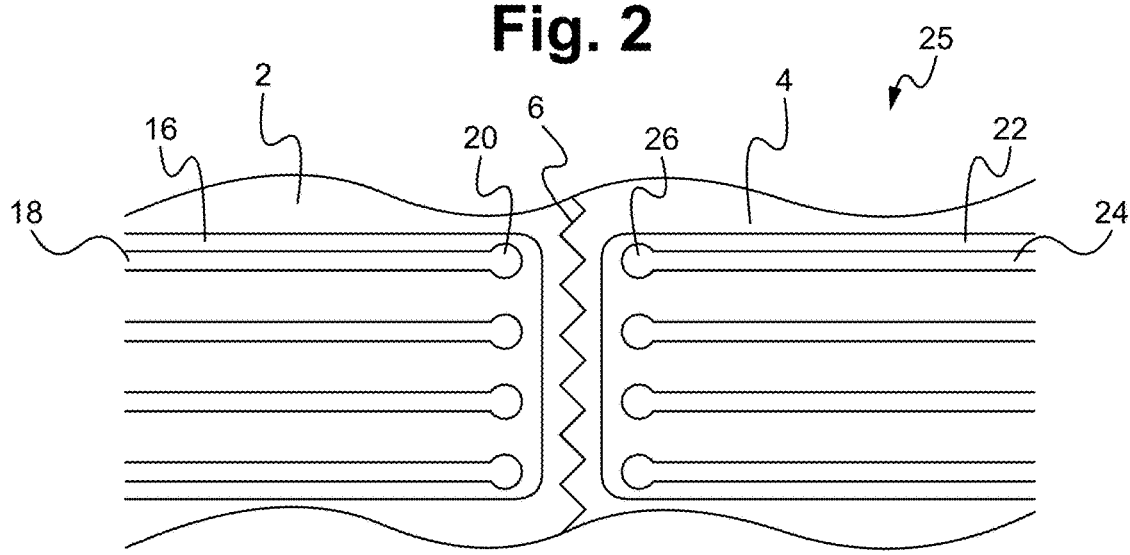
FIG. 3 illustrates the textile having conductive interconnects according to other embodiments.

Conductive interconnects can alternatively be formed on an intermediate substrate, which in turn is attached to the textile. FIG. 3 illustrates the textile 1 having conductive interconnects according to other embodiments. Conductive interconnects 18 are formed on a first substrate 16 and conductive interconnects 24 are formed on a second substrate 22. It is understood that more or less than the four conductive interconnects shown in FIG. 3 can be included. Each of the conductive interconnects 18 has a connection point 20, such as a contact pad, and each of the conductive interconnects 24 has a connection point 26, such as a contact pad. The first substrate 16 is attached to the first textile piece 2, and the second substrate 22 is attached to the second textile piece 4. The substrates 16, 22 are each made of a flexible and/or stretchable material. In some embodiments, the substrates 16, 22 are each made of TPU, which is any of a class of polyurethane plastics with many properties, including flexibility and elasticity. It is understood that alternative flexible and/or stretchable materials can be used. In some embodiments, the substrates 16, 22 are attached to the textile using heat and pressure, so as to weld or laminate.

In some embodiments, the conductive interconnects are printed onto either the textile itself or onto the intermediate substrate. It is understood that the conductive interconnects can be formed using alternative means than printing. In general, the conductive interconnects can be formed using any conventional additive process. In embodiments where the conductive interconnects are applied directly to the textile, the conductive interconnects can be formed as electrically conductive threads woven into or otherwise attached to the textile. Electrically conductive threads, or simply "conductive threads", refer to electrically conductive metal wires, threads with an electrically conductive plating finish, electrically conductive polymers or electrically conductive fibers, or the like capable of electrical conductivity. Although subsequent description may be directed to conductive interconnects printed on a surface of an intermediate substrate or printed onto the textile itself, it is understood that the methods and structures described herein can be directed to conductive interconnects that can be formed using alternative additive processes, applied directly to the textile or to the intermediate substrate, or by incorporating conductive threads in or on the textiles.

The seam in the textile may make it such that a conductive interconnect applied over the seam, either in the form of a conductive interconnect applied directly to the textile as in FIG. 2 or in the form or a conductive interconnect on an intermediate substrate applied to the textile as in FIG. 3, does not provide the required functionality. In such a case, a seam jump connector is configured to span the seam and connect conductive interconnects on either side of the seam.

Figure 4:
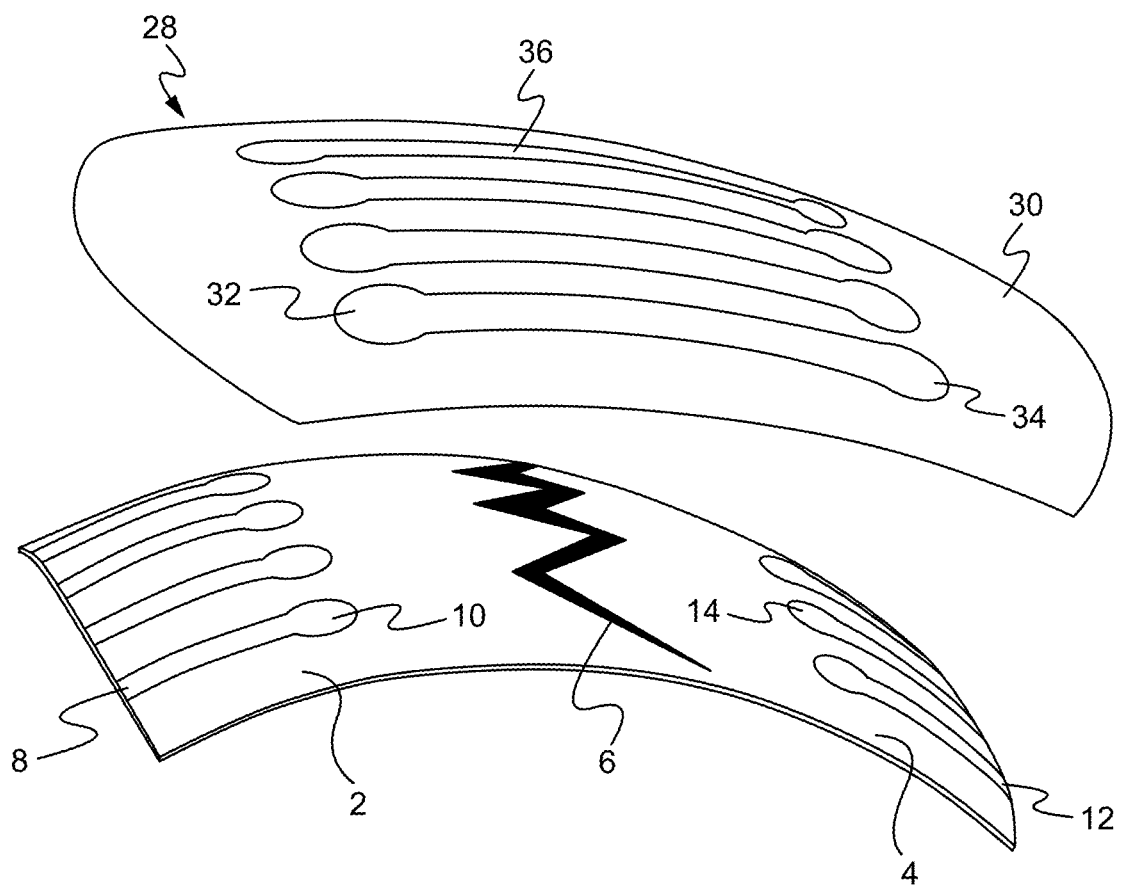
FIG. 4 illustrates a perspective exploded view of a seam jump connector applied to a textile according to some embodiments.

FIG. 4 illustrates a perspective exploded view of a seam jump connector applied to a textile according to some embodiments. In the exemplary application shown in FIG. 4, the seam jump connector is applied to the textile base structure 15 of FIG. 2. The seam jump connector 28 includes a substrate 30 onto which are applied conductive interconnects 36. In some embodiments, the substrate 30 is made of TPU. It is understood that alternative flexible and/or stretchable materials can be used. Each of the conductive interconnects 36 includes a pair of connection points 32 and 34, such as contact pads. The exemplary seam jump connector 28 shown in FIG. 4 is shown in transparency. The conductive interconnects 36 are formed on a surface of the substrate 30 facing the textile 1, and the conductive interconnects and connection points 32, 34 are configured so as to align with corresponding connection points 10, 12 on the textile structure 15. Once the seam jump connector 28 is applied to the textile base structure 15, each connection point 32 is electrically connected to a corresponding connection point 10, and each connection point 34 is electrically connected to a corresponding connection point 14, and an electrical connection is formed from each of the conductive interconnects 8 to a corresponding one of the conductive interconnects 12 via a corresponding one of the conductive interconnects 36 on the seam jump connector 28. Each mated connection point 10, 32 and 14, 34 can be mechanically connected directly to each other, such as by means of mechanical pressure, laser welding, sonic welding, or an intermediate conductive material, such as conductive paste, can be used. In some embodiments, the seam jump connector 28 is laminated onto the textile base structure 15 using heat and pressure to seal and protect the underlying area, as well as to provide the above mentioned connectivity. In some embodiments, a non-conductive adhesive can be applied between the substrate 30 and the textile 1. Reference is made to a "seam" jump connector, however it is understood that the connector is configured to span other types of irregular areas in the textile. Although the exemplary configuration shown in FIG. 4 demonstrates the seam jump connector applied to conductive interconnects formed directly on the textile, it is understood that the seam jump connector can be applied to conductive interconnects formed on an intermediate substrate, such as the configuration shown in FIG. 3.

Figure 5:
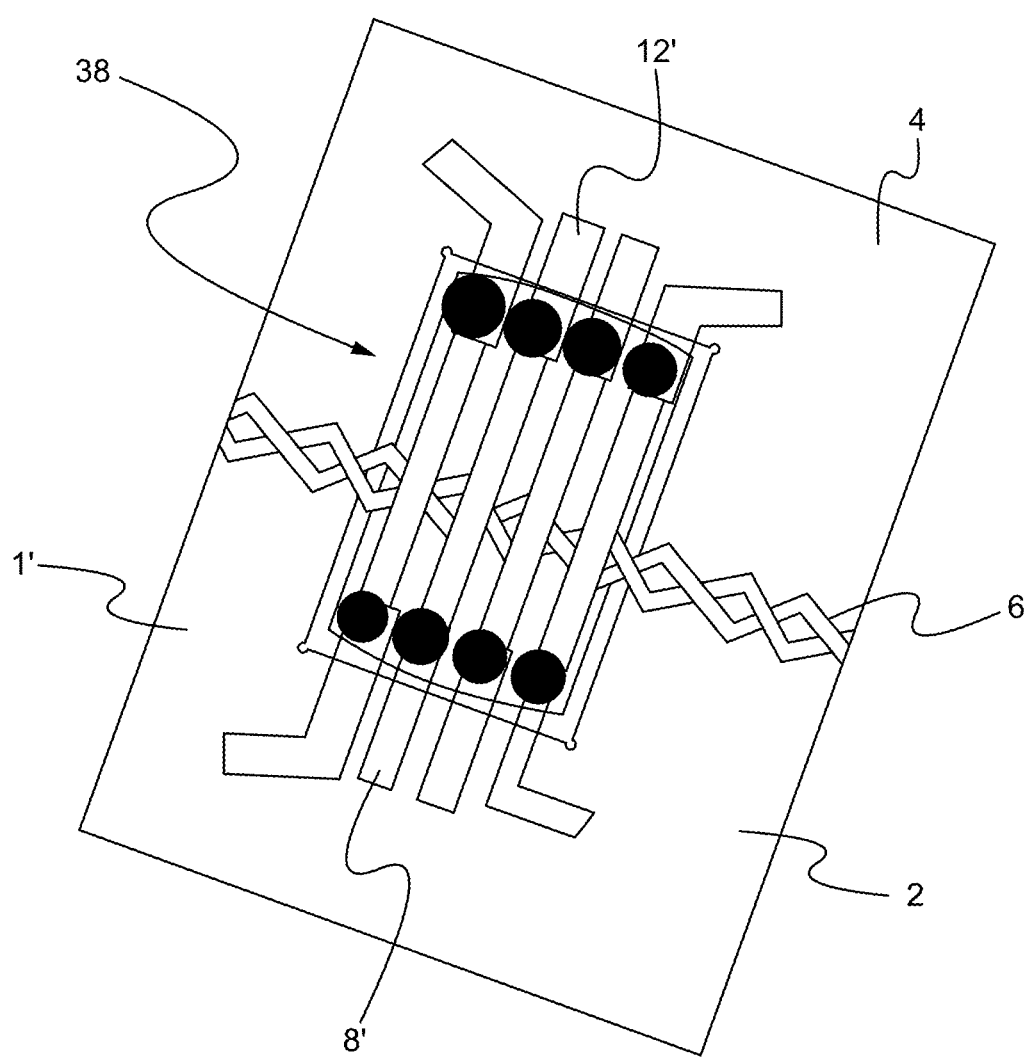
FIG. 5 illustrates a top down view of an alternatively configured seam jump connector attached to a textile base structure according to some embodiments.
Figure 7:
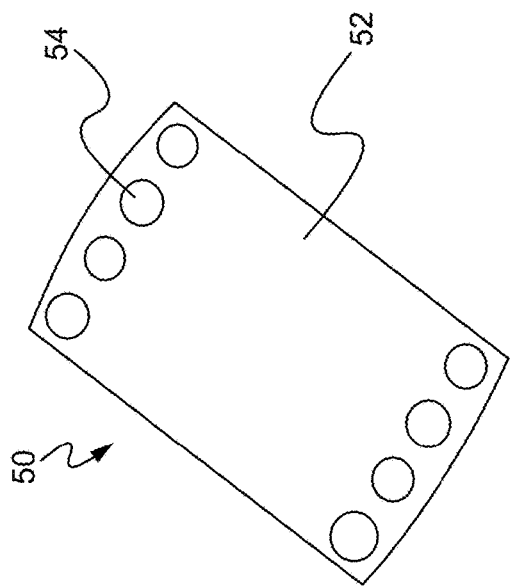
FIG. 7 illustrates a top down view of a cover layer according to some embodiments.
Figure 8:
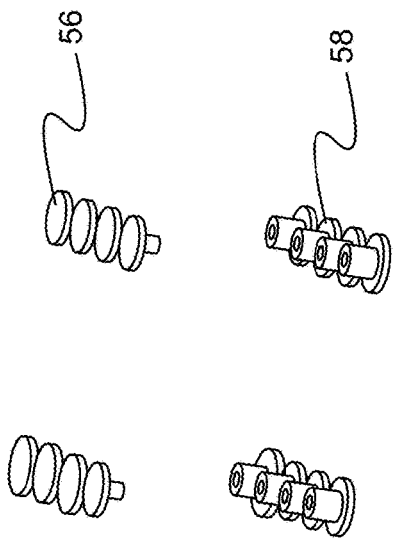
FIG. 8 illustrates a perspective view of rivets and fasteners according to some embodiments.
Figure 6:
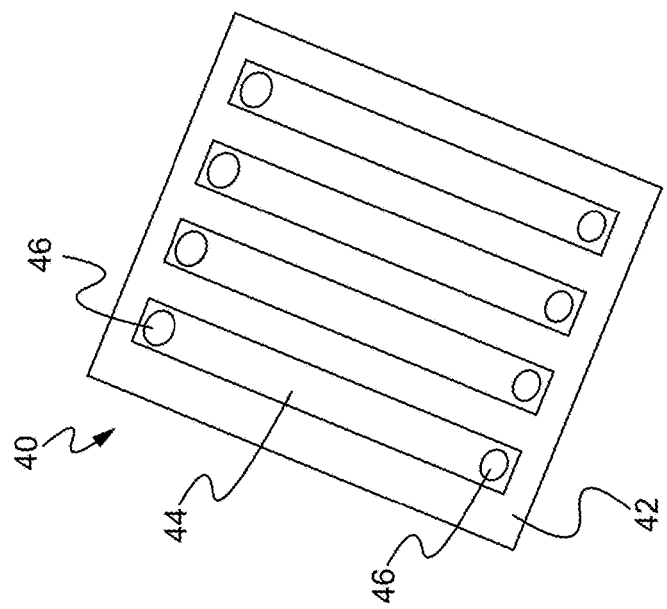
FIG. 6 illustrates a top down view of an interconnect layer according to some embodiments.
Figure 10:
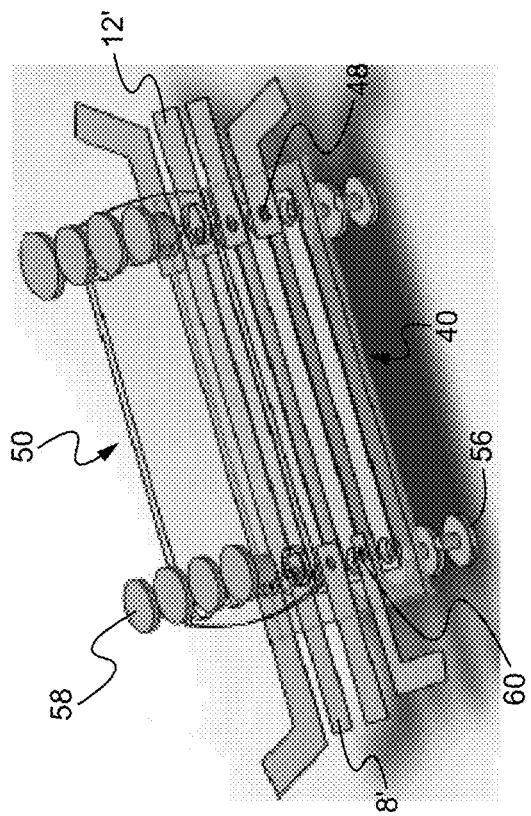
FIG. 10 illustrates a bottom-up exploded view of the seam jump connector aligned for assembly relative to the conductive interconnects and on the textile base structure.
Figure 11:
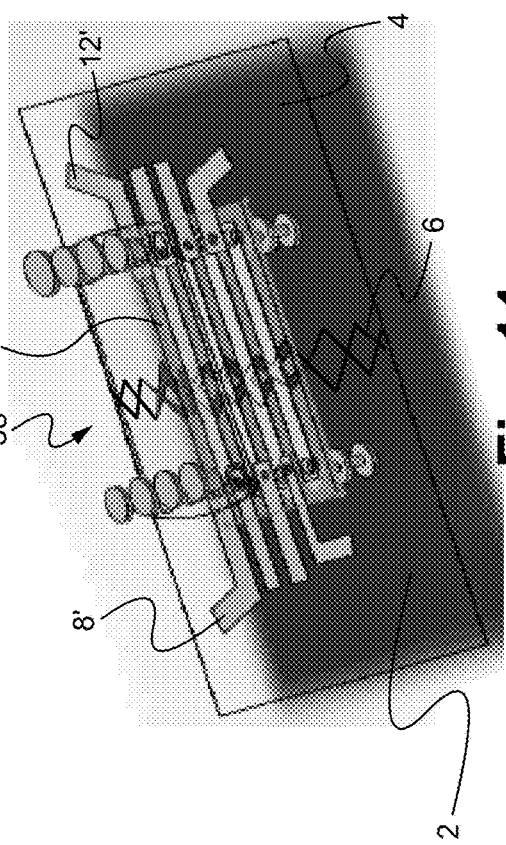
FIG. 11 illustrates a bottom-up exploded view of the seam jump connector aligned for assembly relative to the textile base structure.

Embodiments of a seam jump connector are also contemplated in which the seam jump connector is alternatively attached to the textile base structure. Such alternative attachment means enables the seam jump connector to be removable and re-connectable to the textile base structure. FIG. 5 illustrates a top down view of an alternatively configured seam jump connector attached to a textile base structure according to some embodiments. In the exemplary application shown in FIG. 5, the seam jump connector is applied to a modified version of the textile base structure 15 of FIG. 2, referred to as textile base structure 15'. In particular, the textile base structure 15' is modified by including holes 60, 48 (FIGS. 10 and 11) at the connection points 10, 14 (FIG. 2), where the holes extend through the conductive interconnects 8', 12' at the connection points 10, 14 and through the textile 1', as shown in FIG. 11. The seam jump connector 38 includes an interconnect layer, a cover layer, rivets, and fasteners. FIG. 6 illustrates a top down view of the interconnect layer according to some embodiments. The interconnect layer 40 includes a substrate 42 onto which are applied conductive interconnects 44. In some embodiments, the substrate 42 is made of TPU. It is understood that alternative flexible and/or stretchable materials can be used. A pair of holes 46 extend through each of the conductive interconnects 44 and through the underlying substrate 42. FIG. 7 illustrates a top down view of a cover layer according to some embodiments. The cover layer 50 includes a substrate 52 having holes 54. In some embodiments, the substrate 52 is made of TPU. It is understood that alternative flexible and/or stretchable materials can be used. The holes 54 in the cover layer 50 and the holes 46 in the interconnect layer 40 are configured such that each hole 54 is aligned with a corresponding hole 46 when the cover layer 50 and the interconnect layer 40 are vertically aligned. The holes 54 in the cover layer 50 and the holes 46 in the interconnect layer 40 are further configured such that each vertically aligned pair of holes 46, 54 are aligned with a corresponding hole 48 or 60 (FIGS. 10 and 11) in the textile base structure 15' (FIGS. 10 and 11). FIG. 8 illustrates a perspective view of rivets 56 and fasteners 58 according to some embodiments. It is understood that securing devices other than rivets and fasteners can be used including, but not limited to, snap buttons, clamps, springs, screws, and the like.

Figure 9:
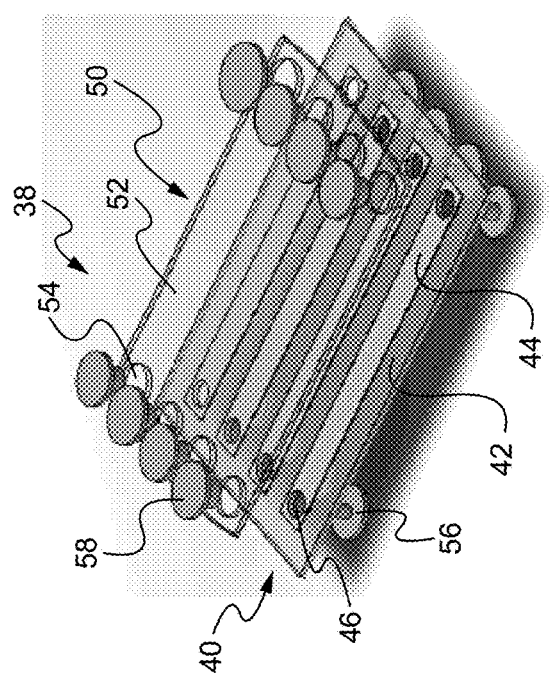
FIG. 9 illustrates a bottom-up exploded view of the seam jump connector having the interconnect layer, the cover layer, the rivets, and the fasteners aligned for assembly.

FIG. 9 illustrates a bottom-up exploded view of the seam jump connector 38 having the interconnect layer 40, the cover layer 50, the rivets 56, and the fasteners 58 aligned for assembly. FIG. 10 illustrates a bottom-up exploded view of the seam jump connector 38 aligned for assembly relative to the conductive interconnects 8' and 12' on the textile base structure 15'. The view shown in FIG. 10 does not include the textile 1' to improve clarity. When the interconnect layer 40 and the cover layer 50 are stacked and properly aligned with the textile base structure 15', a vertically aligned pair of holes 46, 54 in the interconnect layer 40 and the cover layer 50, respectively, is aligned with a corresponding hole 60 through the conductive interconnect 8' and the underlying textile P. Similarly, a vertically aligned pair of holes 46, 54 is aligned with a corresponding hole 48 through the conductive interconnect 12' and the underlying textile P. A rivet 56/fastener 58 pair is aligned with each vertically aligned set of holes 46, 54, 60 and 46, 54, 48. FIG. 11 illustrates a bottom-up exploded view of the seam jump connector 38 aligned for assembly relative to the textile base structure 15'. The exemplary textile 1' shown in FIG. 11 is shown in transparency to illustrate the interconnect layer 40. The view shown in FIG. 11 shows the conductive interconnects 44 of the interconnect layer 40 spanning the seam 6 in the textile P. The interconnect layer 40 is positioned over the surface of the textile 1' that includes the conductive interconnects 8' and 12', with the conductive interconnects 44 facing the textile P. The cover layer 50 is positioned on the opposing side of the textile 1' such that the textile base structure 15' is sandwiched between the interconnect layer 40 and the cover layer 50. When properly aligned, the fasteners 58 extend through the vertically aligned set of holes 46, 54, 60 and 46, 54, 48 to mate with the rivets 56. The mated rivets 56/fasteners 58 compress together the interconnect layer 40, the textile base structure 15', and the cover layer 50, thereby forcing together the end portions of each conductive interconnect 44 with end portions of corresponding conductive interconnects 8' and 12', which forms an electrical interconnection between the conductive interconnects 8', 44, 12'. Each mated connection point between a conductive interconnects 8', 44 and 44, 12' can be mechanically connected directly to each other, or an intermediate conductive material, such as conductive paste, can be used. Although the exemplary configurations shown in FIGS. 5 and 9-11 demonstrates the seam jump connector applied to conductive interconnects formed directly on the textile, it is understood that the seam jump connector can be applied to conductive interconnects formed on an intermediate substrate, such as the configuration shown in FIG. 3.

Figure 12:
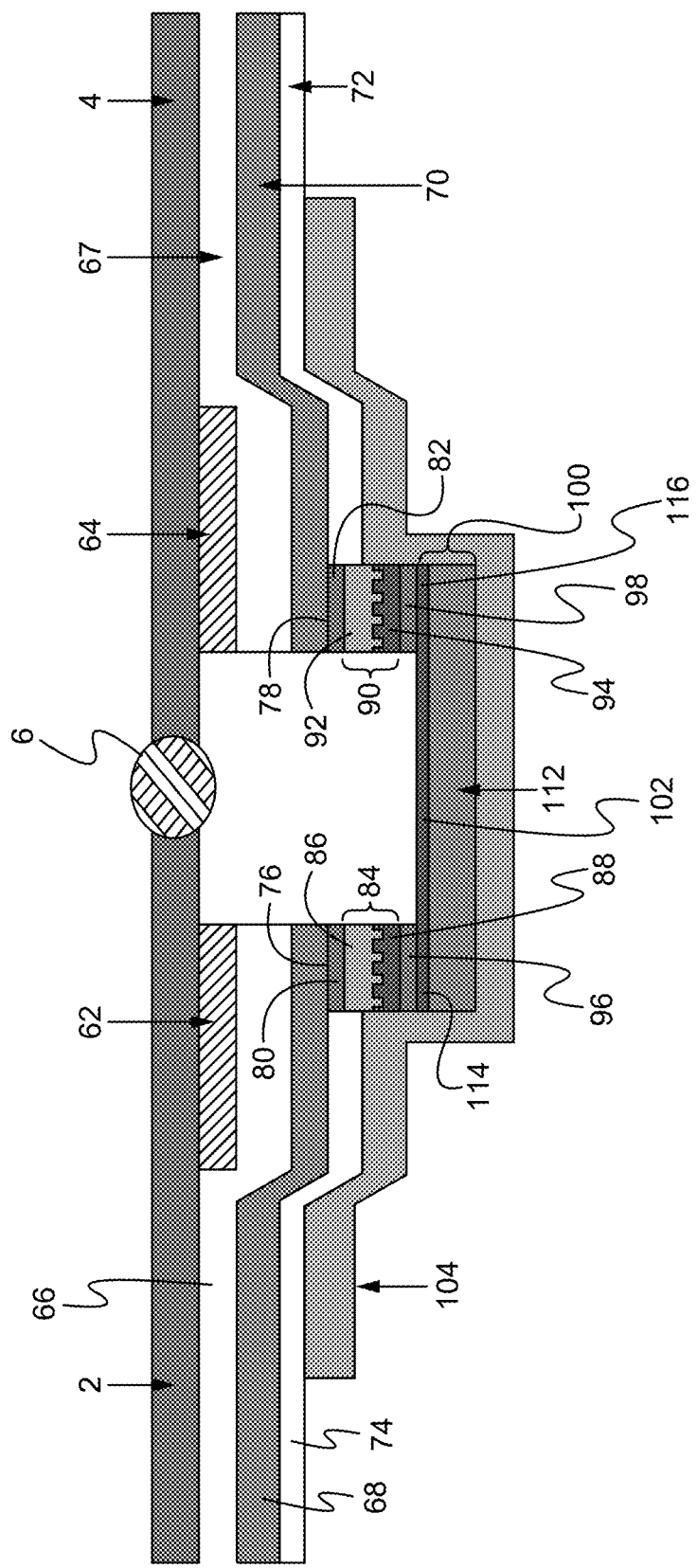
FIG. 12 illustrates a cut out side view of a seam jump connector attached to a textile base structure using electrical connectors according to some embodiments.

Still other embodiments are contemplated in which a seam jump connector is connected to a textile base structure using electrical connectors. A mated pair of electrical connectors are attached at select electrical connection points between the seam jump connector and the textile base structure. A first electrical connector of the mated pair is attached to the textile base structure and provides one or more discrete electrical connection points to corresponding one or more conductive interconnects on the textile base structure. A second electrical connector of the mated pair is attached to the seam jump connector and provides one or more discrete electrical connection points to corresponding one or more conductive interconnects on the seam jump connector. A first mated pair of electrical connectors is connected to the first textile piece and a second mated pair of electrical connectors is connected to the second textile piece. The one or more conductive interconnects of the seam jump connector interconnect the first and second pairs of electrical connectors. FIG. 12 illustrates a cut out side view of a seam jump connector attached to a textile base structure using electrical connectors according to some embodiments. In the exemplary application shown in FIG. 12, the seam jump connector is applied to the textile 1 of FIG. 1 which includes the first textile piece 2 and the second textile piece 4 joined together at the seam 6. A textile base substrate is of the type similar to that shown in FIG. 3. In particular, one or more conductive interconnects 68 are formed on a first substrate 66, and one or more conductive interconnects 70 are formed on a second substrate 67. Each of the conductive interconnects 66 has a connection point 76, such as a contact pad, and each of the conductive interconnects 70 has a connection point 78, such as a contact pad. The first substrate 66 is attached to the first textile piece 2, and the second substrate 67 is attached to the second textile piece 4. The substrates 66, 67 are each made of a flexible and/or stretchable material. In some embodiments, the substrates 66, 67 are each made of TPU. It is understood that alternative flexible and/or stretchable materials can be used. In some embodiments, the substrates 66, 67 are attached to the textile using heat and pressure, so as to weld or laminate. In some embodiments, an encapsulating layer 72 encapsulates the substrate 67 to mask the conductive interconnects 70, except the connection point 78 of each conductive interconnect 70 is left exposed, and an encapsulating layer 74 encapsulates the substrate 66 to mask the conductive interconnects 68, except the connection point 76 of each conductive interconnect 68 is left exposed. The encapsulating layers 72, 74 can be made of TPU or other insulating material having flexible and/or stretchable characteristics.

The electrical connector 84 includes a mated pair of electrical connectors 86 and 88, and the electrical connector 90 includes a mated pair of electrical connectors 92 and 94. The electrical connector 86 includes one or more connection points configured to be coupled to corresponding connection point 76 of each of the one or more conductive interconnects 68. Each of the connection points of the electrical connector 84 can be mechanically coupled directly the corresponding connection point 76 of the conductive interconnect 68 or by an intermediate conductive material, such as conductive adhesive 80. The electrical connector 92 includes one or more connection points configured to be coupled to corresponding connection point 78 of each of the one or more conductive interconnects 70. Each of the connection points of the electrical connector 92 can be mechanically coupled directly the corresponding connection point 78 of the conductive interconnect 70 or by an intermediate conductive material, such as conductive adhesive 82. Various types of electrical connectors with mated pairs can be used, where the mated pairs can be removably coupled and de-coupled. Examples of such electrical connectors include, but are not limited to, coaxial connectors and coaxial wires, wire-to-board connectors, magnetic connectors, and low profile ZIF (zero insertion force) connectors.

The electrical connector 88 and the electrical connector 94 are each connected to a connectivity bridge 100. In some embodiments, the connectivity bridge 100 is configured and functions similarly to the seam jump connector 28 of FIG. 4. In the exemplary configuration shown in FIG. 12, the connectivity bridge 100 includes a substrate 112 onto which are applied one or more conductive interconnects 102. In some embodiments, the substrate 112 is made of TPU. It is understood that alternative flexible and/or stretchable materials can be used. Each of the conductive interconnects 102 includes a pair of connection points 114 and 116, such as contact pads. The conductive interconnects 102 are formed on a surface of the substrate 112 facing the textile 1, and the conductive interconnects 102 and connection points 114, 116 are configured so as to align with corresponding connection points on the electrical connectors 88, 94, respectively. The electrical connector 88 includes one or more connection points configured to be coupled to corresponding connection point 114 of each of the one or more conductive interconnects 102. Each of the connection points of the electrical connector 88 can be mechanically coupled directly the corresponding connection point 114 of the conductive interconnect 102 or by an intermediate conductive material, such as conductive adhesive 96. The electrical connector 94 includes one or more connection points configured to be coupled to corresponding connection point 116 of each of the one or more conductive interconnects 102. Each of the connection points of the electrical connector 94 can be mechanically coupled directly the corresponding connection point 116 of the conductive interconnect 102 or by an intermediate conductive material, such as conductive adhesive 98.

In some embodiments, optional stiffeners 62 and 64 are added to relieve strain from the electrical connectors 86, 92 and the connectivity bridge 100. An exemplary material for the stiffeners is polycarbonate films, although it is understood that alternative materials can be used. In some embodiments, an encapsulating patch 104 is applied over the connectivity bridge 100 and proximate surrounding area (of the textile base structure). The encapsulating patch 104 is made of an non-conducting, flexible and/or stretchable, insulating material. Examples of such materials include, but are not limited to, an acrylic with a shore hardness of A30, a polyurethane, a thermoplastic elastomer (TPE), or a silicon. The encapsulating patch 104 can be adhered to the proximate surrounding area of the textile base structure using a low adhesive. The encapsulating patch 104 is configured to be removably coupled to the textile base structure, similar conceptually to an adhesive bandage. A low adhesive encapsulating patch and detachable electrical connectors enable the connectivity bridge 100 to be removable from the underlying textile base structure.

The seam jump connectors, including the connectivity bridge, described above can also be modified to include electronic components. In such modifications, additional conductive interconnects can be formed to interconnect such electronic components. Additionally, the substrate of the seam jump connectors described above can be representative of a multi-layered circuit board, such as a FPC, or a stack of one or more connected multi-layered circuit boards, such as a PCB (printed circuit board) connected to a FPC. An FPC can include a plurality of stacked layers, the layers made of one or more non-conductive layers and one or more conductive layers. The non-conductive layers are made of flexible material. Flexible materials can include, but are not limited to, polyimide, polyethylene teraphthalate (PET), polyethylene nitride (PEN) or polyurethane. The conductive layers are each electrically conductive layers made of a metal, such as copper, that are patterned into electrically conductive traces, or interconnects. In some embodiments, an outer surface of the FPC is a combination of insulating material (non-conductive layer) and conductive interconnects (such as outer layer portion of vias, contact pads/bond pads, conductive traces or other patterned conductive interconnects). A connection area is formed on a portion of the outer surface insulating material. The connection area provides an electrical connection point between one or more interconnects within the FPC and an external element, such as a connection point of an electrical connector or a textile base structure.

Removable seam jump connectors enable easy replacement of defective electronic components and/or circuit boards that constitute the seam jump connector, and also enables selective removal of the seam jump connector from the textile during certain activities, such as washing of the textile.

Figure 13:
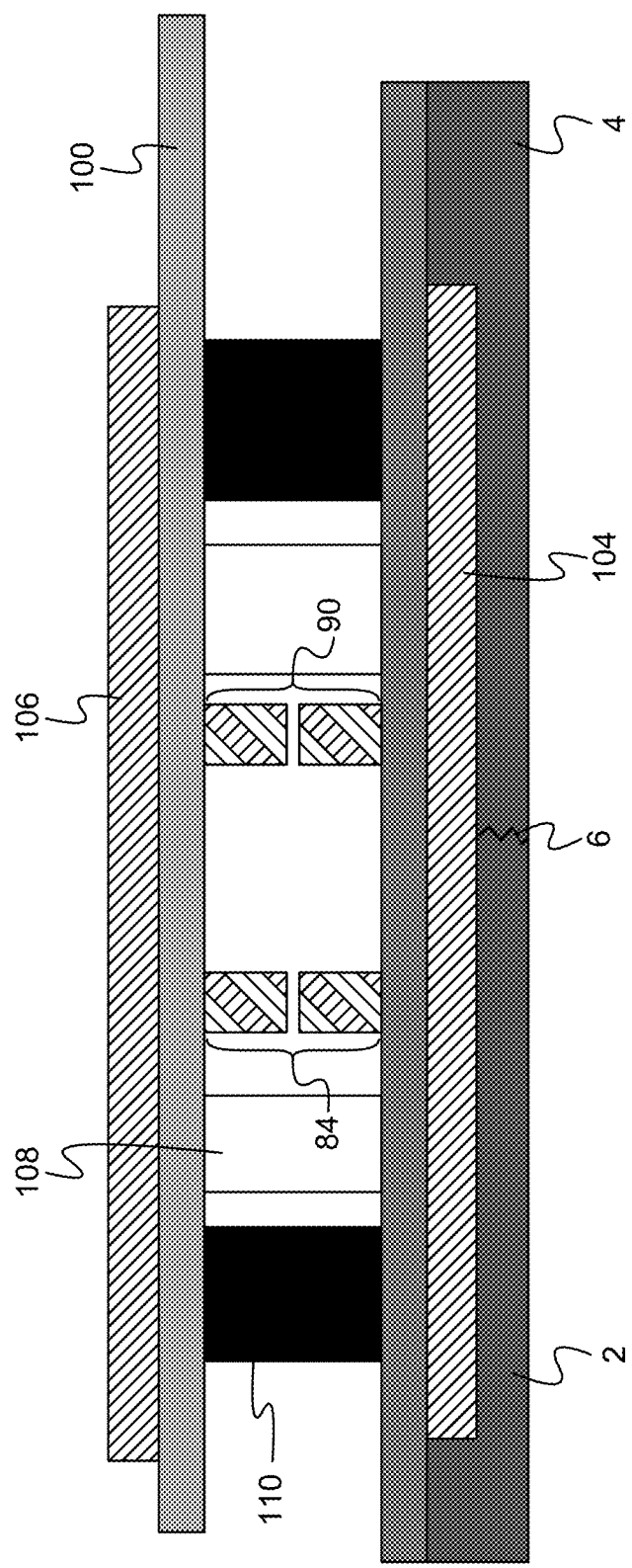
FIG. 13 illustrates a cut out side view of a block diagram showing a seam jump connector sealed and secured to a textile base structure according to some embodiments.

In the configuration shown in FIG. 12, the seam jump connector is secured to the textile base structure using a removable encapsulating patch. It is understood that alternative methods and structures can be used. In some embodiments, a sealing barrier and a pressure maintaining device can be used to seal the seam jump connector and to secure the seam jump connector in place. FIG. 13 illustrates a cut out side view of a block diagram showing a seam jump connector sealed and secured to a textile base structure according to some embodiments. The textile base structure can be structured similarly to that shown in FIG. 12. In the exemplary configuration shown in FIG. 13, an optional stiffener 104 coupled to the textile 2, 4 is shown in place of the two separate stiffeners 62, 64 in FIG. 12. It is understood, that two separate stiffeners can be used instead of the single stiffener 104. The seam jump connector can be structured similarly to that shown in FIG. 12. The details of the seam jump connector are not shown in FIG. 13 for simplicity, and are simply represented by the connectors 84, 90 and the connectivity bridge 100. A sealing structure 108 is formed around the electrical connectors 84, 90, and between the textile base structure and the connectivity bridge 100. In some embodiments, the sealing structure is a moisture resistant o-ring. A pressure maintaining device 110 is formed around the sealing structure 108, and between the textile base structure and the connectivity bridge 100. In some embodiments, the pressure maintaining device 100 includes magnets attached to the textile base structure and the connectivity bridge 100. It is understood that alternative pressure maintaining devices can be used including, but not limited to, a 3M Dual-lock Re-Closable Fastener™, rivets, snaps, screws, and other devices that can be coupled and decoupled. It is also understood that where the seam jump connector is not intended to be removable, permanent pressure maintaining devices can be used including, but not limited to, thermoplastic (hot glue), thread, lace, and the like. An additional optional stiffener 106 can be positioned on the connectivity bridge 100. The stiffeners 104, 106 form a two-shell configuration that provides compression for sealing the sealing structure 108. FIG. 14 illustrates a top down view of the relative positions of the sealing structure 108 and the pressure maintaining device 110 relative to the electrical connectors 84 and 90 according to some embodiments.

In the exemplary configuration shown in FIG. 14, all of the electrical connectors are surrounded by a common sealing structure and pressure maintaining device. In other embodiments, each of the electrical connectors can be individually isolated. FIG. 15 illustrates a top down view of individually isolated electrical connectors. A sealing structure 118 is formed around the electrical connector 84, and between the textile base structure and the connectivity bridge 100 (FIG. 13). A pressure maintaining device 120 is formed around the sealing structure 118, and between the textile base structure and the connectivity bridge 100. A sealing structure 122 is formed around the electrical connector 90, and between the textile base structure and the connectivity bridge 100. A pressure maintaining device 124 is formed around the sealing structure 122, and between the textile base structure and the connectivity bridge 100. For simplicity, only the electrical connectors, sealing structures, and pressure maintaining devices are shown in FIG. 15.

The present invention has been described in terms of specific embodiments incorporating details to facilitate the understanding of the principles of construction and operation of the e-textile interconnects. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:
1. A conductive interconnect assembly comprising;
   a. a textile having an irregular area;
   b. a first conductive interconnect coupled to the textile and positioned on a first side of the irregular area, wherein the first conductive interconnect includes a first connection point;
   c. a second conductive interconnect coupled to the textile and positioned on a second side of the irregular area, the second side is separated from the first side by the irregular area, wherein the second conductive interconnect includes a second connection point; and
   d. an irregular area jump connector comprising a flexible substrate and a third conductive interconnect coupled to the flexible substrate, the third conductive interconnect comprising a third connection point and a fourth connection point, wherein the irregular area jump connector is stacked over the irregular area of the textile, over at least the first connection point of the first conductive interconnect, and over at least the second connection point of the second conductive interconnect, and the third connection point is aligned with and coupled to the first connection point, and the fourth connection point is aligned with and coupled to the second connection point to form an electrical connection between the first conductive interconnect, the second conductive interconnect, and the third conductive interconnect.

2. The conductive interconnect assembly of claim 1 wherein the first conductive interconnect and the second conductive interconnect are positioned directly on a surface of the textile.

3. The conductive interconnect assembly of claim 1 wherein the flexible substrate comprises thermoplastic polyurethane (TPU).

4. The conductive interconnect assembly of claim 1 wherein the flexible substrate comprises a flexible printed circuit (FPC).

5. The conductive interconnect assembly of claim 1 wherein the irregular area comprises a seam in the textile.

6. The conductive interconnect assembly of claim 1 wherein the first connection point and the third connection point are mechanically connected directly to each other, and the second connection point and the fourth connection point are mechanically connected directly to each other.

7. The conductive interconnect assembly of claim 1 further comprising a first conductive adhesive positioned between the first connection point and the third connection point, and a second conductive adhesive positioned between the second connection point and the fourth connection point.

8. The conductive interconnect assembly of claim 1 wherein the irregular area jump connector is laminated to the textile.

9. The conductive interconnect assembly of claim 1 further comprising a plurality of first conductive interconnects coupled to the textile and positioned on the first side of the irregular area, and a plurality of second conductive interconnects coupled to the textile and positioned on the second side of the irregular area, wherein the irregular area jump connector further comprises a plurality of third conductive interconnects coupled to the flexible substrate, further wherein the third connection point of each third conductive interconnect is aligned with and coupled to the first connection point of a corresponding one first conductive interconnect, and the fourth connection point of each third conductive interconnect is aligned with and coupled to the second connection point of a corresponding one second conductive interconnect.

10. A conductive interconnect assembly comprising;
   a. a textile having an irregular area;
   b. a first conductive interconnect coupled to the textile and positioned on a first side of the irregular area, wherein the first conductive interconnect includes a first connection point;
   c. a second conductive interconnect coupled to the textile and positioned on a second side of the irregular area, the second side is separated from the first side by the irregular area, wherein the second conductive interconnect includes a second connection point;
   d. an irregular area jump connector comprising a flexible substrate and a third conductive interconnect coupled to the flexible substrate, the third conductive interconnect comprising a third connection point and a fourth connection point, wherein the irregular area jump connector is stacked over the irregular area of the textile, over at least the first connection point of the first conductive interconnect, and over at least the second connection point of the second conductive interconnect, and the third connection point is aligned with and coupled to the first connection point, and the fourth connection point is aligned with and coupled to the second connection point to form an electrical connection between the first conductive interconnect, the second conductive interconnect, and the third conductive interconnect; and
   e. a first substrate having a first surface onto which the first conductive interconnects are coupled and a second surface opposing the first surface, and a second substrate having a first surface onto which the second conductive interconnects are coupled and a second surface opposite the first surface, wherein the first surface of the first substrate is coupled to the first side of the textile and the first surface of the second substrate is coupled to the second side of the textile.

11. The conductive interconnect assembly of claim 10 wherein the first substrate and the second substrate each comprise thermoplastic polyurethane (TPU).

12. A conductive interconnect assembly comprising;
  a. a textile having an irregular area;
  b. a first conductive interconnect coupled to the textile and positioned on a first side of the irregular area, wherein the first conductive interconnect includes a first connection point;
  c. a second conductive interconnect coupled to the textile and positioned on a second side of the irregular area, the second side is separated from the first side by the irregular area, wherein the second conductive interconnect includes a second connection point; and
  d. an irregular area jump connector comprising a flexible substrate and a third conductive interconnect coupled to the flexible substrate, the third conductive interconnect comprising a third connection point and a fourth connection point, wherein the irregular area jump connector is stacked over the irregular area of the textile, over at least the first connection point of the first conductive interconnect, and over at least the second connection point of the second conductive interconnect, and the third connection point is aligned with and coupled to the first connection point, and the fourth connection point is aligned with and coupled to the second connection point to form an electrical connection between the first conductive interconnect, the second conductive interconnect, and the third conductive interconnect, wherein the irregular area jump connector further comprises a cover layer, a first securing device, and a second securing device, further wherein the cover layer is stacked over an opposite side of the textile as the flexible substrate, and the first securing device and the second securing device compress together the stack.

13. A conductive interconnect assembly comprising;
  a. a textile having an irregular area;
  b. a first conductive interconnect coupled to the textile and positioned on a first side of the irregular area, wherein the first conductive interconnect includes a first connection point;
  c. a second conductive interconnect coupled to the textile and positioned on a second side of the irregular area, the second side is separated from the first side by the irregular area, wherein the second conductive interconnect includes a second connection point;
  d. an irregular area jump connector comprising a flexible substrate and a third conductive interconnect coupled to the flexible substrate, the third conductive interconnect comprising a third connection point and a fourth connection point, wherein the irregular area jump connector is stacked over the irregular area of the textile, over at least the first connection point of the first conductive interconnect, and over at least the second connection point of the second conductive interconnect, and the third connection point is aligned with and coupled to the first connection point, and the fourth connection point is aligned with and coupled to the second connection point to form an electrical connection between the first conductive interconnect, the second conductive interconnect, and the third conductive interconnect; and
  e. a first mated pair of electrical connectors and a second mated pair of electrical connectors, wherein the first mated pair comprises a first electrical connector coupled to the first connection point of the first conductive interconnect and a second electrical connector coupled to the third connection point of the third conductive interconnect, further wherein the second mated pair comprises a third electrical connector coupled to the second connection point of the second conductive interconnect and a fourth electrical connector coupled to the fourth connection point of the third conductive interconnect.

14. The conductive interconnect assembly of claim 13 wherein the flexible substrate comprises a flexible printed circuit (FPC).

15. The conductive interconnect assembly of claim 14 further comprising a printed circuit board (PCB) coupled to the FPC.

16. The conductive interconnect assembly of claim 15 wherein the PCB is coupled to the FPC via a PCB to FPC connector.

17. The conductive interconnect assembly of claim 13 wherein the first mated pair of electrical connectors and the second mated pair of electrical connectors each comprise magnetically attracted connectors.

18. The conductive interconnect assembly of claim 13 wherein the first mated pair of electrical connectors and the second mated pair of electrical connectors each comprise zero force insertion (ZIF) connectors.

* * * * *